US005703494A

United States Patent [19]

Sano

[11] Patent Number: 5,703,494
[45] Date of Patent: Dec. 30, 1997

[54] PROBING TEST APPARATUS

[75] Inventor: Kunio Sano, Yamanashi-ken, Japan

[73] Assignee: Tokyo Electron Limited, Tokyo, Japan

[21] Appl. No.: 553,013

[22] Filed: Nov. 3, 1995

[30] Foreign Application Priority Data

Nov. 9, 1994 [JP] Japan .................................. 6-300260

[51] Int. Cl.$^6$ .................................................. G01R 31/02
[52] U.S. Cl. ............................................. 324/761; 324/754
[58] Field of Search .................................. 324/754, 761, 324/755, 757, 758; 439/482

[56] References Cited

U.S. PATENT DOCUMENTS 5,304,921  4/1994  Cook et al. ............................ 324/758

FOREIGN PATENT DOCUMENTS 6-216205  8/1994  Japan .
6-37337   9/1994  Japan .

*Primary Examiner*—Vinh P. Nguyen
*Assistant Examiner*—Anh Phung
*Attorney, Agent, or Firm*—Oblon, Spivak, McClelland, Maier & Neustadt, P.C.

[57] ABSTRACT

A probing test apparatus comprising a probe card having a plurality of probes and first terminals contacted with and electrically connected to conductive pads of a circuit, a test head having a signal transmitting circuit through which the test signal is transmitted to the probes, a performance board having second terminals electrically connected to the signal transmitting circuit, a contact ring interposed between the performance board and the probe card and whose impedance has been adjusted, a plurality of first-type pogopins each having a pair of pin members contacting the first and second terminals to transmit the test signal to the probes, and a plurality of second-type pogopins each having a pair of pin members contacting the first and second terminals, the second-type pogopins being arranged in the contact ring, surrounding each first-type pogopin in a plane perpendicular to the axes of the pin members, and electrically connected to the first terminal grounded.

11 Claims, 8 Drawing Sheets

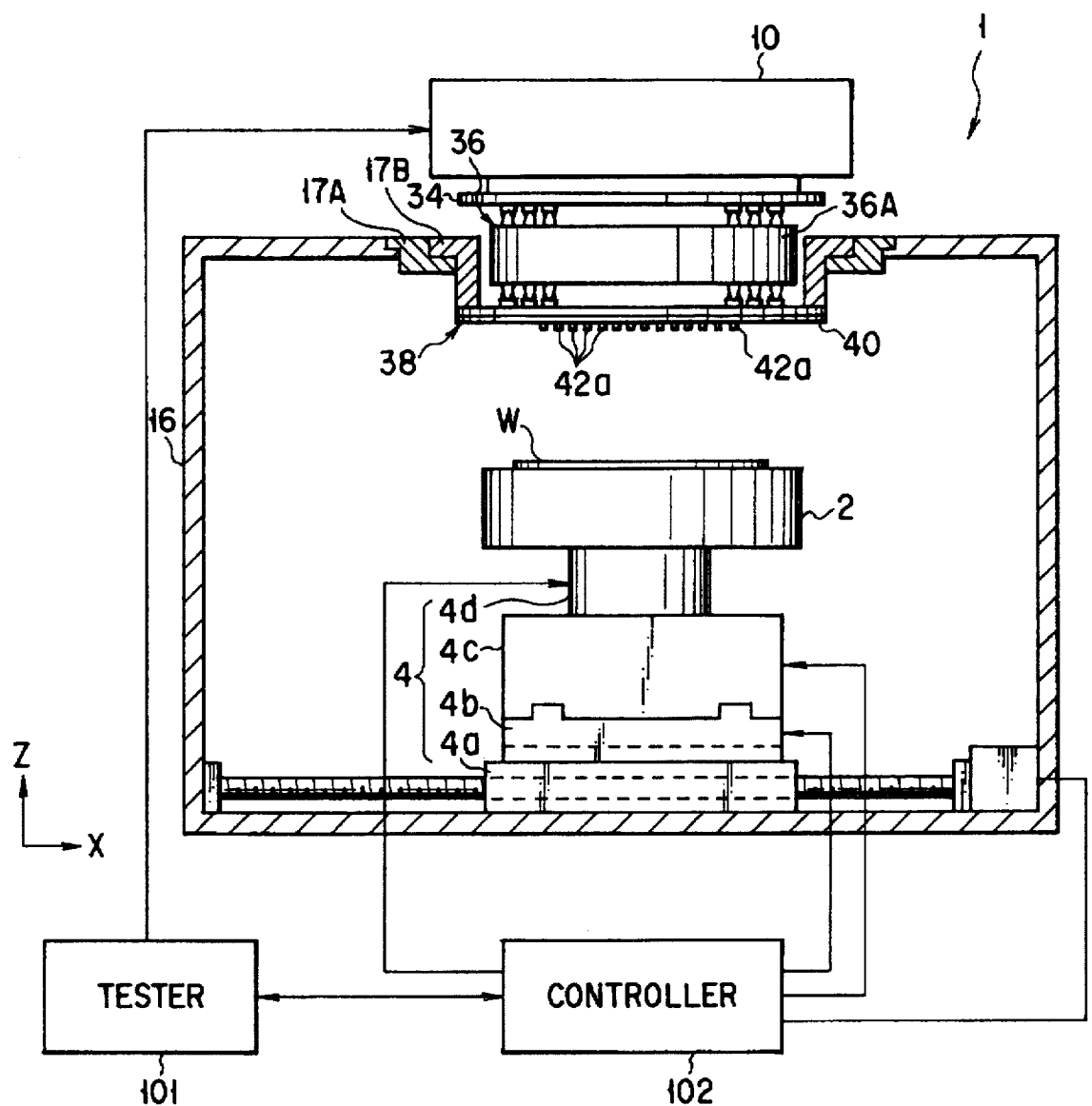
F I G. 3

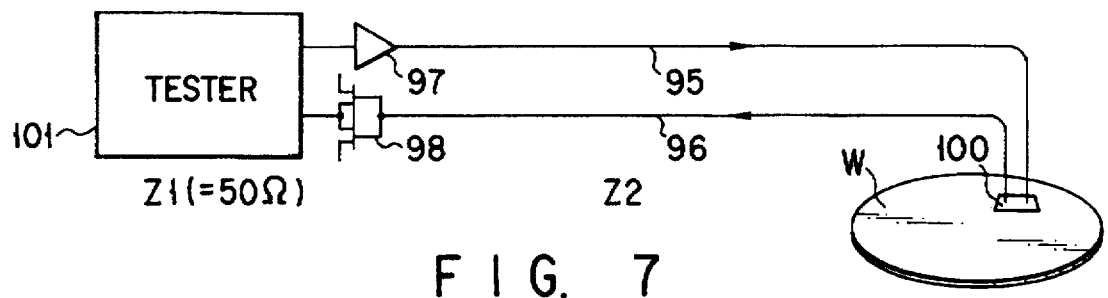
F I G. 7
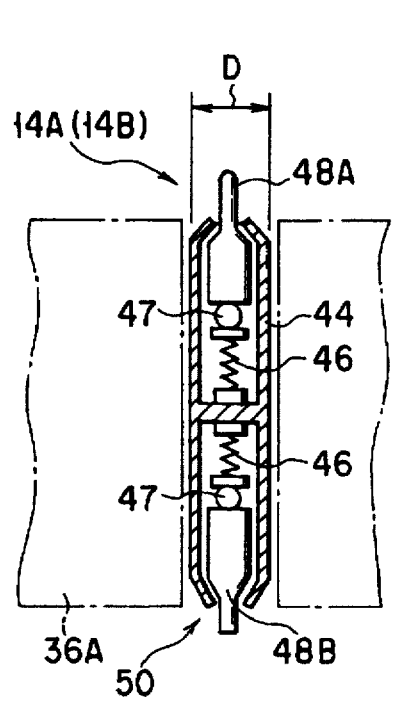
F I G. 8
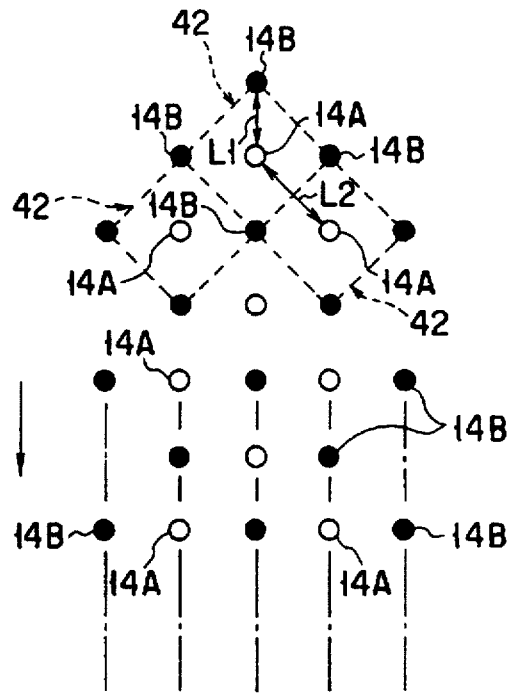
F I G. 9
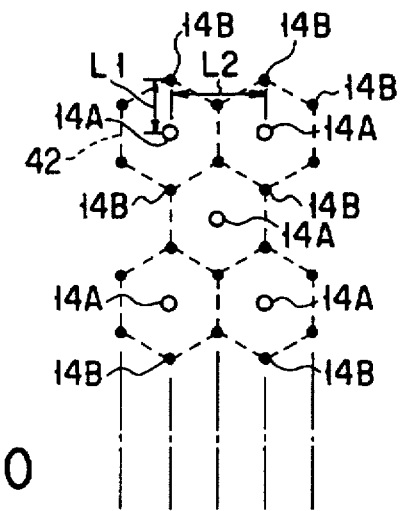
F I G. 10

5,703,494

PROBING TEST APPARATUS

BACKGROUND OF THE INVENTION

1. Field of the Invention

The present invention relates to a probing test apparatus for testing electric properties of each device circuit and, more particularly, pogopins of a signal transmission line through which a test signal is transmitted to the circuit of a probe card.

2. Description of the Related Art

The probing test apparatus is used to test the circuit of each semiconductor chip formed on a wafer. Integrated circuits have been asked these days to have a higher operation speed and signal frequency used for the probing test, therefore, moves nearer to a range of several 10 s MHz to about 100 MHz or higher than this range.

The signal transmission line extending from a tester to probes can be treated as a distributed constant circuit. In order to transmit test signal having this high frequency to probe, it is needed that test signal is as little distorted as possible in waveform by reflected wave. To attain a more accurate property test, it is also needed that the signal transmission line has as small an electrostatic capacity as possible and that impedance matching is kept as high as possible over the signal transmission line.

One of the conventional probing test apparatus has a pogopin holder ring 12 provided with a plurality of pogopins 14A and 14B arranged as shown in FIGS. 1 and 2. Signal transmitting pogopins 14A and no signal transmitting pogopins (or grounded pogopins) 14B are co-axially and radially arranged in the pogopin holder ring 12.

To transmit the test signal, a grounded line is used together with a signal line on which the test signal is carried. In the pogopin holder ring 12 of the conventional probing test apparatus, a group of signal transmitting pogopins 14A are on a circle and a group of grounded pogopins 14B on another circle, and which circles are alternately and coaxially arranged. In addition, pogopins 14 are plotted radially from the center of the pogopin holder ring 12 to the peripheral area thereof. Each interval between adjacent pogopins 14 on a circle becomes larger as the circle comes nearer to the peripheral portion of the ring 12.

The impedance of each signal transmitting pogopin 14A is determined, depending upon a small capacity formed between the pogopin 14A and its environmental pogopins 14. The interval between adjacent pogopins 14, however, becomes larger, as described above, as the circle comes nearer to the peripheral area of the ring 12. Each pogopin 14, therefore, has a larger impedance as it comes nearer to the peripheral area of the ring 12. Each of signal transmitting pogopins 14A has a different impedance, accordingly.

Further, adjacent pogopins 14A on a circle are same signal ones. They therefore interfere with one another, thereby making problems of crosstalk and impedance irregularity serious.

When impedance irregularity exists of the signal transmitting pogopins 14A, as described above, signal waveform distortion depends upon the impedance irregularity, thereby causing each pogopin 14A to have a signal waveform distorted. This prevents a more accurate and higher speed property test from being realized.

Coaxial pogopins each enclosed by a grounded cylinder may be used. In this case, however, they are quite more expensive to thereby increase the cost. In addition, they becomes larger in size. The number of them which can be arranged in the ring 12 is thus made smaller. This is contrary to the trend of increasing them more and more.

SUMMARY OF THE INVENTION

The object of the present invention is therefore to provide a probing test apparatus capable of making each signal pogopin impedance same in value and also making the speed of test higher while using test signal having a high frequency without causing any crosstalk.

According to the present invention, there can be provided a probing test apparatus for testing electric properties of a circuit while sending a test signal to the circuit to be tested comprising; a probe card having a plurality of probes and first terminals to be contacted with and to be electrically connected to conductive pads of the circuit to be tested; a test head having a signal transmitting circuit through which the test signal is transmitted to each of the probes; a performance board having second terminals electrically connected to the signal transmitting circuit of the test head; a contact ring interposed between the performance board and the probe card and whose impedance has been adjusted; a plurality of first-type pogopins each having a pair of pin members contacting the first and second terminals to transmit the test signal to each of the probes; and a plurality of second-type pogopins each having a pair of pin members contacting the first and second terminals, the second-type pogopins being arranged in the contact ring, surrounding each of the first-type pogopins in a plane perpendicular to the axes of the pin members, and electrically connecting the first terminal grounded.

It is desirable in this case that each first-type pogopin is positioned in the center of a polygonal block which is formed in the plane by four or more second-type pogopins. It is also desirable that the polygonal block is shaped like a square, rectangle, regular hexagon or regular octagon, and more desirably, in the square.

According to the probing test apparatus of the present invention, an interval $L_1$ between the first and the second-type pogopin is made smaller than an interval $L_2$ between two adjacent first-type pogopins. Interaction between the first-type pogopins can be thus made least. The impedance of each first-type pogopin can be therefore made substantially same in value, thereby enhancing test accuracy to a greater extent. In addition, the test signal having a high frequency can be used for the test. When such high frequency test signal is used, the speed of test can be increased.

Further, test signal passing through two adjacent first-type pogopins causes no noise relative to the other signals, thereby causing no crosstalk.

Furthermore, all of the first-type pogopins can be made to have substantially same impedance value, how many first-type pogopins may be used. This is more suitable for the trend of letting the contact ring have as many pogopins as possible.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a block diagram showing the probing test apparatus according to an embodiment of the present invention;

FIG. 7 is a view intended to explain the characteristic impedance of a test signal transmission circuit;

FIG. 8 is a sectional view showing a pogopin enlarged, said pin being inserted into a pin hole in the contact ring (or pogopin ring);

FIG. 9 is a plan view schematically showing how the signal transmitting pogopin (or first pogopin) is arranged relative to grounded pogopins (or second pogopins) in the ring;

FIG. 10 is a plan view showing another arrangement of the signal transmitting pogopin relative to grounded pogopins;

DETAILED DESCRIPTION OF THE PREFERRED EMBODIMENTS

Figure 1:
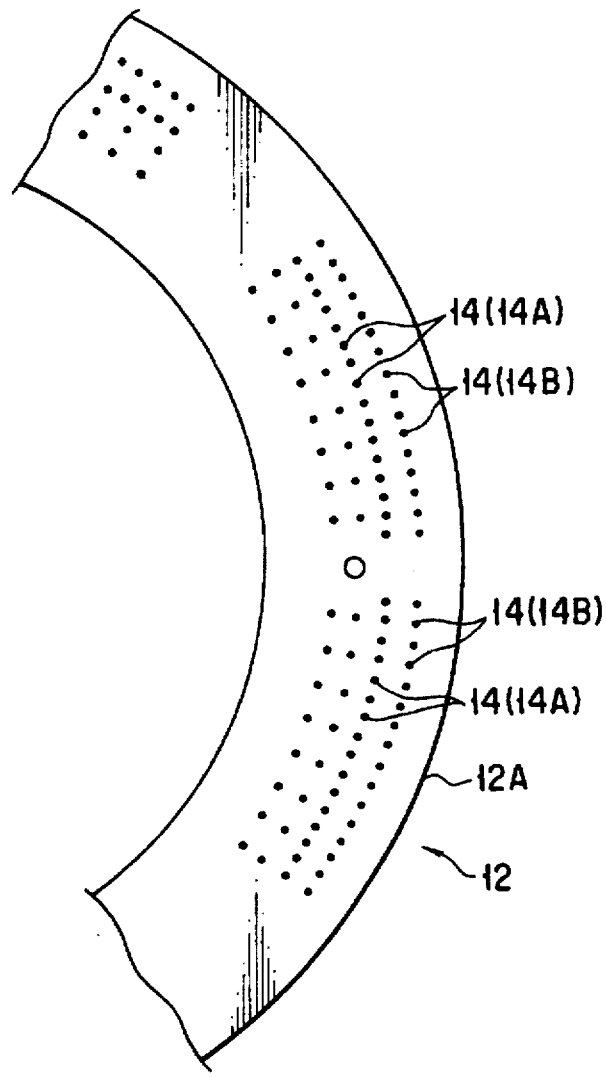
FIG. 1 is a plan view showing a part of the conventional pogopin holder ring.

Some preferred embodiments of the present invention will be described with reference to the accompanying drawings.

As shown in FIG. 3, a wafer-mounted table 2 is arranged in an outer casing 16 of a probing test apparatus 1. It houses a vacuum chuck for attracting and holding a semiconductor wafer W thereon. It is mounted on a alignment stage 4, which is provided with X-, Y- and Z-axis carrier mechanisms 4a, 4b and 4c and a θ-rotation swing mechanism 4d. The X-axis carrier mechanism 4a has a drive motor and a ball screw, and a controller 102 is connected to a power switch for the drive motor. Power switches for other mechanisms 4b, 4c and 4d are also connected to the controller 102. The X- and Y-axis carrier mechanisms 4a and 4b step-move the alignment stage 4 in X- and Y-axis directions only by a distance which is integral times the size of an IC chip 100.

An opening is formed in the top of the outer casing 16 and a probe card 38 is arranged in the opening. The probe card 38 is supported by an attaching ring 17B, which is attached to the casing 16 through an insert ring 17A. The probe card 38 is opposed to the wafer W on the table 2.

Figure 6:
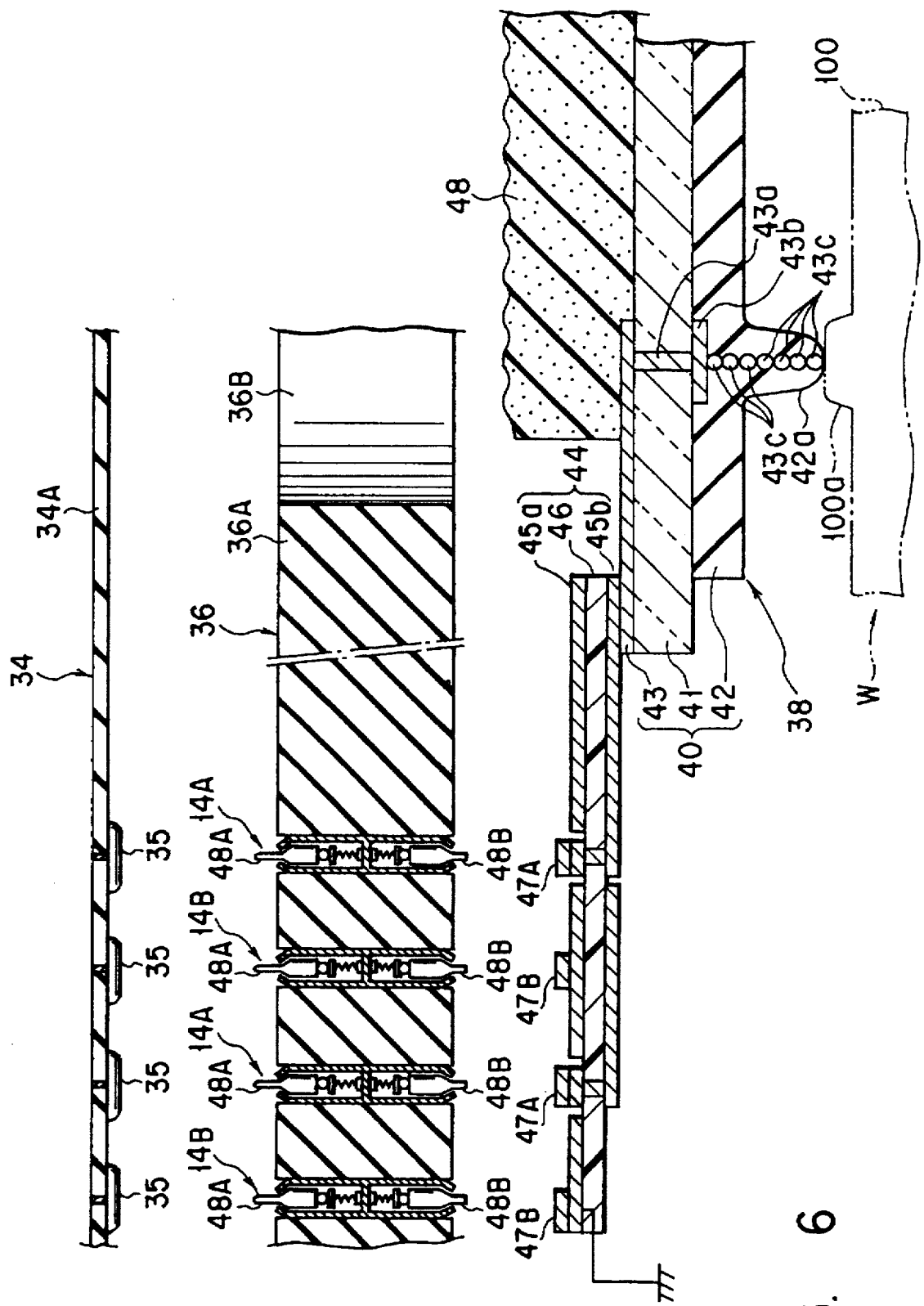
FIG. 6 is a vertically-sectioned view showing a performance board, the contact ring (or pogopin ring), and a probe card.

As shown in FIG. 6, the probe card 38 has a contact assembly 40 and a flexible printing plate 44. The contact assembly 40 includes a rigid insulating plate 41, a flexible insulating plate 42 and a conductive pattern circuit 43, and a plurality of contactors 42a are projected from the underside of the flexible insulating plate 42. The contact assembly 40 is backed up by an elastic member 48 to force all of the contactors 42a contacted with pads 100a. Plural small balls 43c are embedded like a chain in each contactor 42a and they are electrically connected to the conductive pattern circuit 43 through a through-conductor 43a. Further, the conductive pattern circuit 43 is electrically connected to a circuit 45 of the flexible printing plate 44. A plurality of terminals 47A and 47B are formed on the top of an insulating member 46 of the flexible printing plate 44. Terminals 47A are connected to the signal transmitting circuit 45 but other terminals 47B are grounded without being connected to the circuit 45. This probe card 38 is disclosed in U.S. Ser. No. 07/978,389, for example.

A contact ring (or pogopin ring) 36 is arranged just above the probe card 38. A contact ring body 34A is made of insulating material and a plurality of terminals 35 are exposed from the underside of the insulating body 34A. The terminals 35 are electrically connected to the signal transmitting circuit of a test head 10.

The test head 10 is located above the casing 16 and supported swingable by a hinge mechanism (not shown). Responsive to command applied from a tester 101, it sends test signal to the probe card 38 through the performance board 34 and the contact ring 36. Signal having a high frequency ranging from several 10s MHz to several 100s MHz (e.g., maximum frequency 300 MHz) is used as test signal.

Figure 5:
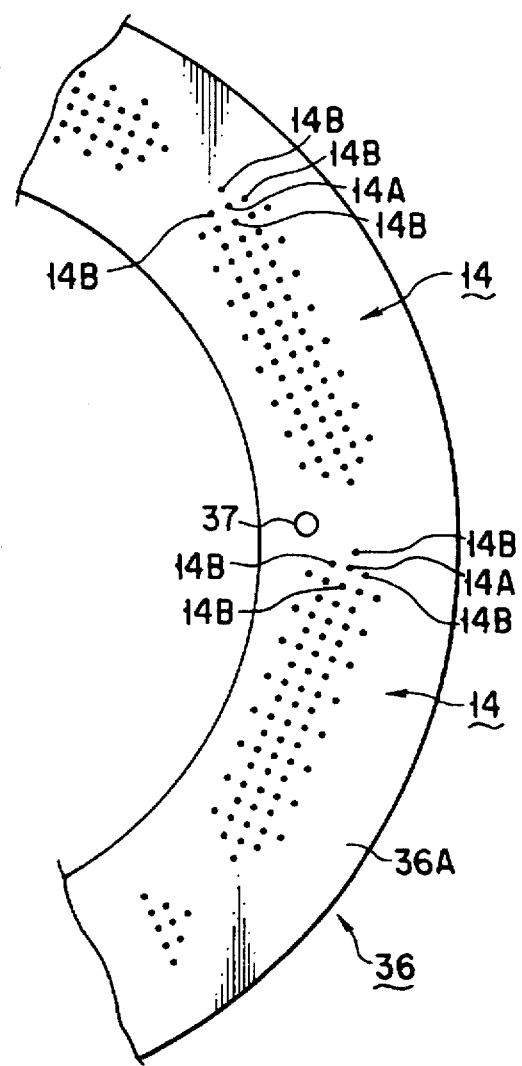
FIG. 5 is a plan view showing a part of the pogopin holder contact ring.

A pogopin ring body 36A is made of insulating material such as glass epoxy and Bakelite resins to make the impedance of each signal pogopin 14A substantially same. The ring body 36A is made about 5 mm thick. As shown in FIG. 5, plural holes 37 are formed in it and when screws are inserted into the holes 37, the pogopin ring 36 is connected to the probe card 38. Groups of pogopins 14A and 14B are arranged along the peripheral portion of the ring body 36A.

The impedance matching of test signal transmitting circuit will be described, referring to FIG. 7.

To prevent a signal from being reflected from a contact area where the contactors 42a are contacted with the pads 100a, characteristic impedance $Z_2$ of a circuit between the tester 101 and the probe card 38 is made equal to impedance $Z_1$ of an inner circuit of the tester 101, and reflection coefficient $\rho(=(Z_2-Z_1)/(Z_2+Z_1))$ is made zero. The characteristic impedance $Z_1$ of the tester's inner circuit is certain or 50Ω, for example. The characteristic impedance $Z_2$ is therefore measured and circuit of the performance board 34, circuit of the contact ring 36 and circuit of the probe card 38 are set to keep the value of total impedance in whole area thus measured to be 50Ω. Particularly first-type and second-type pogopins 14A and 14B of the contact ring 36 add great influence to the characteristic impedance $Z_2$. Therefore, their size and shape are quite important.

As shown in FIG. 8, each pogopin 14A (or 14B) includes a cylindrical conductive pin holder 44 having a diameter D of about 1.5 mm. The pin holder 44 is divided into upper and lower chambers, in the upper of which a contact pin 48A is housed while in the lower of which a contact pin 48B is housed. Each of these pins 48A and 48B is urged by a spring 46. The tip of the upper pin 48a is projected from the top of the contact ring 36 while the tip of the lower pin 48B from the underside thereof. A ball 47 is interposed between the spring 46 and each of the contact pins 48A and 48B. Each of the pins 48A, 48B has a diameter larger at its base than at its front portion. In addition, each of upper and lower openings of the pin holder 44 has a diameter smaller than that of the base of each contact pin 48A, 48B. The pins 48A and 48B can be thus prevented from coming out of the pin holder 44.

A method of making the pogopin ring 36 will be described in brief. The pogopin ring body 36A made of glass epoxy resin is drilled to form a plurality of through-holes 50 therein. The pogopin 14A (or 14B) is inserted into each through-hole 50 in such a way that the upper and lower pins 48A and 48B can be projected from the top and underside of the pogopin ring body 36A only by same distance. The pogopin 14A (or 14B) may be bonded, in this case, to the ring body 36A by adhesive.

In a plan view shown in FIG. 9, blank dots denote first (or signal) pogopins 14A and painted dots (or solid dots) second pogopins (or grounded pogopins) 14B. Each first-type pogopin 14A is surrounded by four second-type pogopins 14B. In short, each first-type pogopin 14A is positioned in a center of a square block which is formed by four second-type pogopins 14B. In this plane perpendicular to the axes of the pin members 48A, 48B, two grounded pogopins 14B are made common to two adjacent blocks 42. The first and second-type pogopins 14A and 14B are arranged in square blocks 42 in this case, but they may be arranged in rectangular blocks or others shown in FIGS. 10 and 11.

Providing in this plane arrangement that the interval between the first 14A and the second-type pogopin 14B is denoted by $L_1$ and that the interval between the first adjacent pogopins 14A by $L_2$, the interval $L_1$ becomes smaller than the interval $L_2$. Namely, the ratio $(L_1/L_2)$ becomes smaller than one. When the second-type pogopins 14B are located near each first-type pogopin 14A in this manner, it can be made more difficult for each signal pogopin 14A to receive noise signal from adjacent signal ones. No crosstalk can be thus caused. In addition, the impedance of the pogopin ring 36 becomes smaller. Further, a larger number of pogopins 14A and 14B can be arranged in the contact ring 36. In short, the contact ring 36 can be made smaller in size. Several 100s first-type pogopins 14A and several 100s second-type pogopins 14B can be arranged in the contact ring 36 in this example. The distance $L_1$ is set to be about 3.0 mm in this case. It depends upon the distance $L_2$, the number of second-type pogopins 14B located near around, the dielectric constant of that material of which the contact ring 36 is made, and patterns of contactors 35 and 47.

Figure 11:
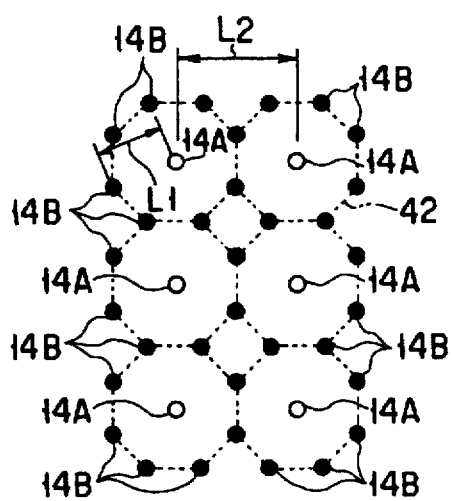
FIG. 11 is a plan view showing a further arrangement of the signal transmitting pogopin relative to grounded pogopins.
Figure 12:
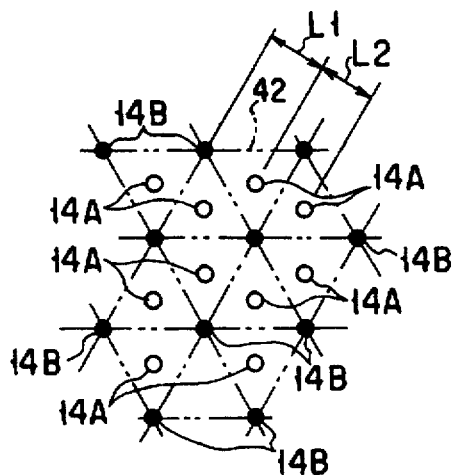
FIG. 12 is a plan view showing a still further arrangement of the signal transmitting pogopin relative to grounded pogopins.

Other plane arrangements of pogopins will be described with reference to FIGS. 10 through 12.

As shown in FIG. 10, each first-type pogopin 14A may be positioned in a center of a regular hexagonal block 42 which is formed by six second-type pogopins 14B. And, as shown in FIG. 11, each first-type pogopin 14A may be positioned in a center of a regular octagonal block 42 which is formed by eight second-type pogopins 14B. The ratio $(L_1/L_2)$ becomes smaller than one in any of these plane arrangements. It is not preferable, however, that each first-type pogopin 14A is positioned in a center of a regular triangle block 42 which is formed by three second-type pogopins 14B, as shown in FIG. 12. Because the ratio $(L_1/L_2)$ becomes larger than one. When so, crosstalk is caused by signal noise entering from adjacent signal pogopins 14A and the impedance of the pogopin ring 36 is increased.

The operation of the above-described probing test apparatus will be described.

The wafer W is mounted on the table 2, which is then lifted to contact the contactors 42a with pads 100a of the IC chip. Test signal which comprises a pulse train is sent from the side of the test head 10 to the side of the probe card 38. It is transmitted to contactors 42a through first-type pogopins 14A. When the test relating to one chip 100 is finished, the table 2 is moved in the X- or Y-axis direction only by a distance which is equal to the size of one chip 100. Same process as described above is then repeated.

Figure 2:
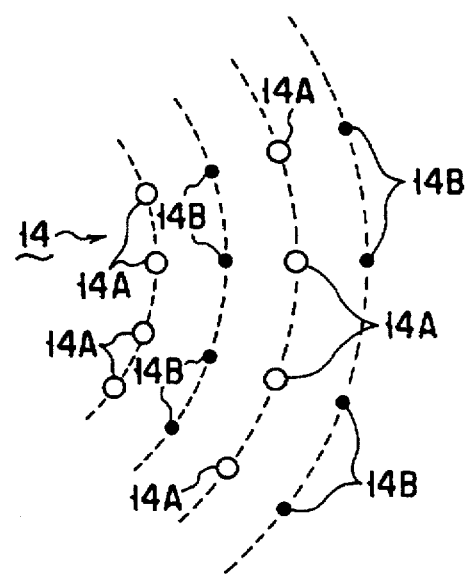
FIG. 2 is a plan view schematically showing how signal transmitting pogopins are conventionally arranged relative to grounded pogopins.
Figure 4:
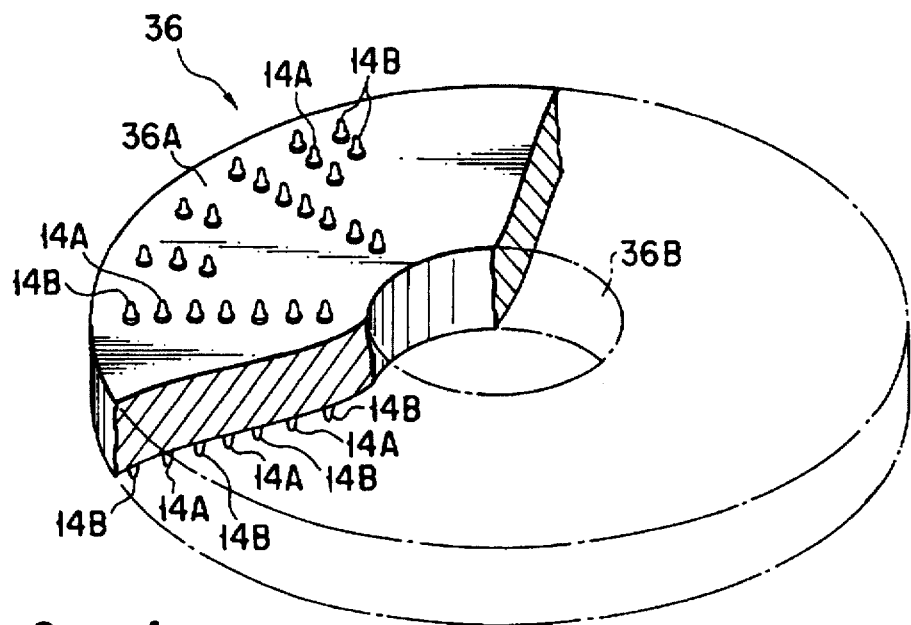
FIG. 4 is a perspective view showing a pogopin holder contact ring.

Signal having high frequency ranging from several 10s MHz to several 100s MHz is used as test signal. Signal reflection and waveform distortion are thus caused by impedance change in the signal transmitting line. These problems are more easily caused particularly in the pogopin ring which serves as a main portion of the signal transmitting line. In the conventional pogopin ring 12 shown in FIGS. 1 and 2 and in which pogopins 14 are radially arranged, the impedance of the pogopin 14 arranged nearer to the center of the pogopin ring 12 is different from that of the pogopin 14 arranged nearer to the peripheral area thereof. Therefore, the extent to which signal waveform passing through these pogopins 14A is reflected becomes different every pogopin 14A. As the result, the state under which signal waveform is transmitted becomes different every pogopin 14A through which it passes, thereby changing the signal waveform thus arriving at each chip pad 100a. Test accuracy can be thus made low.

According to the probing test apparatus of the present invention, however, test signal passing through each first-type pogopin 14A can keep its correct waveform without being reflected. Therefore, the impedance of each signal pogopin 14A becomes substantially same in value, thereby enhancing test accuracy to a greater extent and also enabling test signal having a high frequency to be used to carry out test. The more a frequency of test signal becomes high, the more a test speed increases.

Further, the distance $L_2$ between the first-type pogopins 14A and 14A is made larger than the distance $L_1$ between the first 14A and the second-type pogopin 14B. This makes it more difficult for noise signal to enter to each first-type pogopin 14A from near around, thereby causing no crosstalk.

Furthermore, all of the first-type pogopins 14A can be made to have substantially same impedance value how many first-type pogopins 14A may be used. This is more suitable for the trend of letting the contact ring have as many pogopins as possible.

Although the probing test apparatus of the membrane type having the flexible probe card 38 has been described above, the present invention is not limited to this embodiment but it may be applied to a probing test apparatus of the probe needle type having a common probe card 238 shown in FIGS. 13 through 16. The typical probing test apparatus shown in FIGS. 13 through 16 has probes 218 each extending downward and obliquely. The present invention can also be applied to an apparatus with the vertical type probe card (VTPC) having probes each extending downward and vertically.

The probing test apparatus of the probe type having the common probe card 238 shown in FIGS. 13 through 16 will be described. Same components as those in the above-described embodiment will be described only when needed.

Figure 13:
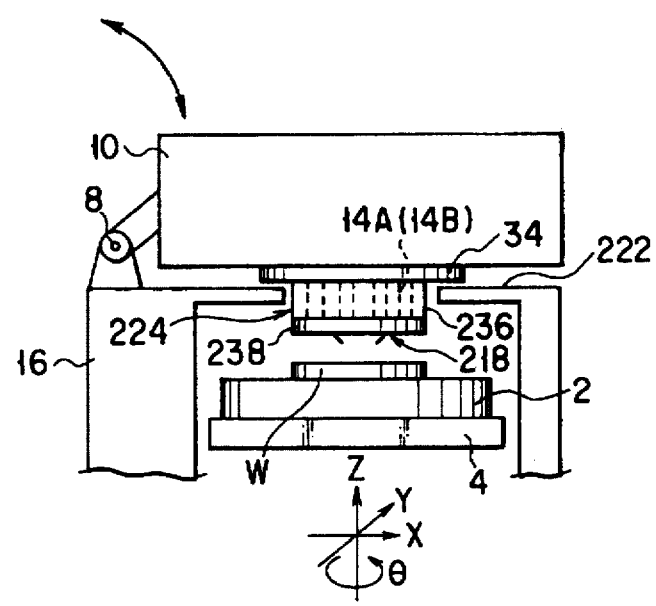
FIG. 13 is a view showing the probing test apparatus according to another embodiment of the present invention.

As shown in FIG. 13, the test head 10 can be swung toward a top 222 of the casing 16 by hinges 8, and the performance board 34, a pogopin ring 236 and the probe card 238 are attached to the underside of the test head 10.

Figure 14:
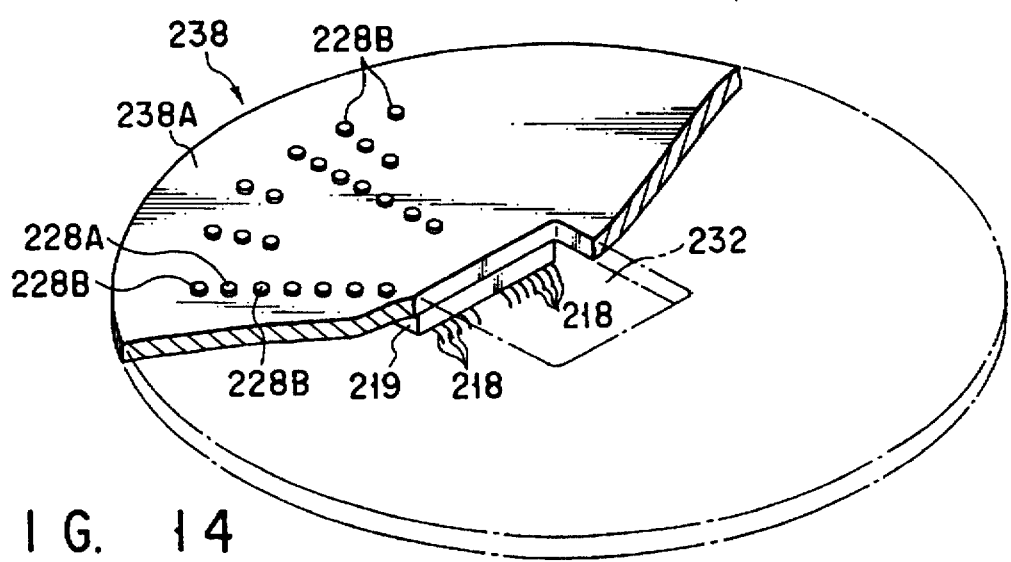
FIG. 14 is a perspective view showing a probe card.
Figure 15:
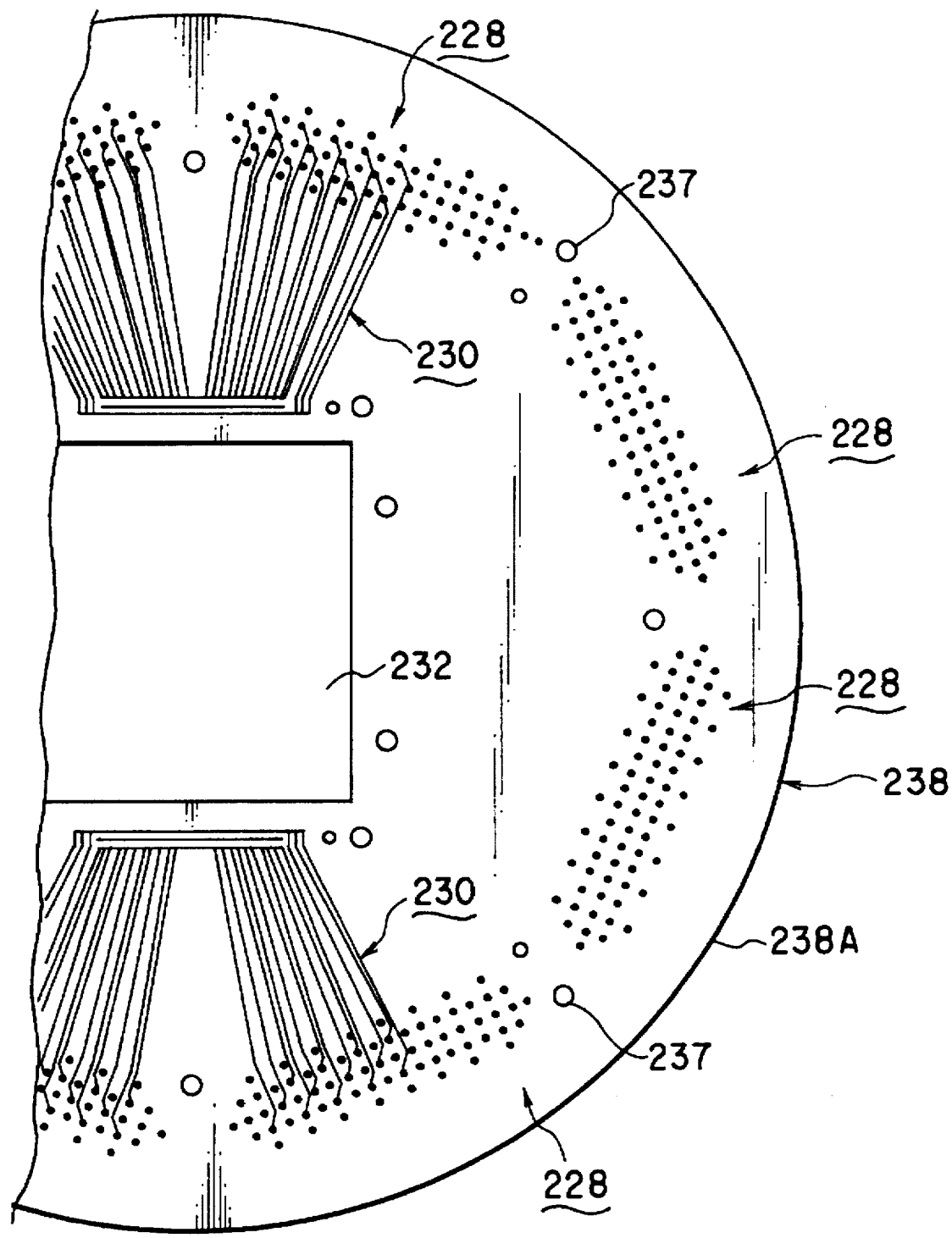
FIG. 15 is a plan view showing a part of the probe card.

As shown in FIGS. 14 and 15, contact terminals 228 of the probe card 238 are arranged in a same pattern as that in the above-described embodiment. They comprises signal transmitting terminals 228A and grounded terminals 228B. The signal transmitting terminals 228A are connected to probe needles 218 via lines 230. The terminals 228B are grounded. Lines of probe needles 218 are along rims of a center rectangular opening 232 in the probe card 238, which is attached to the pogopin ring 236 by screwing screws into holes 237.

Figure 16:
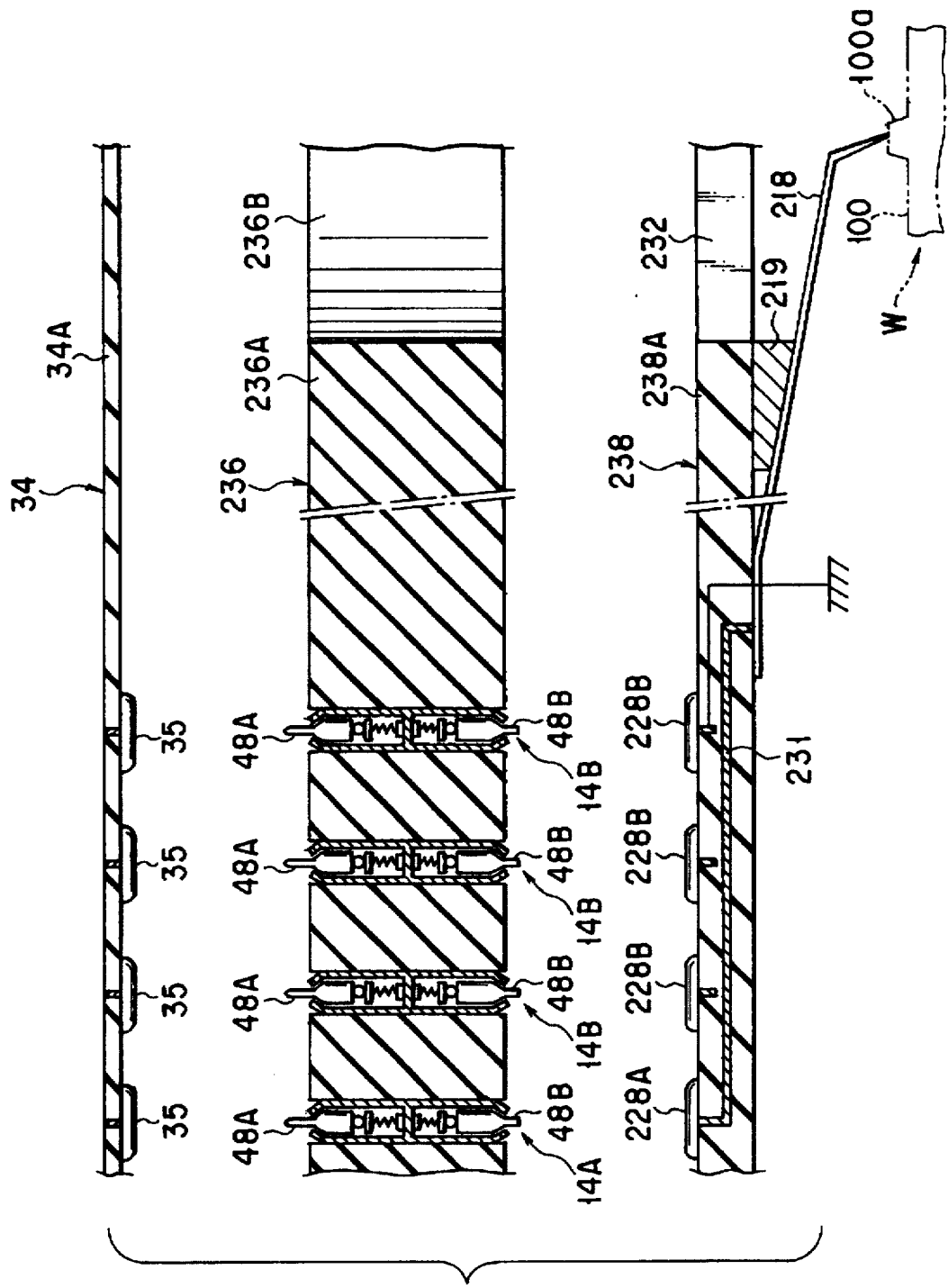
FIG. 16 is a vertically-sectioned view showing a performance board a contact ring (or pogopin ring) and the probe card.

As shown in FIG. 16, a plurality of pogopins 14A and 14B are attached to the pogopin ring 236. The first and second-type pogopins 14A and 14B are arranged as shown in FIGS. 9 through 11. The front end of the upper pin 48A of each pogopin 14A (or 14B) is projected from the top of the contact ring 236 to contact the terminal 35 of the performance board 34, while the front end of the lower pin 48B is projected from the bottom of the contact ring 236 to contact the terminal 228 of the probe card 238. A part of the terminals 228A is connected to the probes 218 via an internal wiring 231.

According to the above-described second probing test apparatus, the impedance of each signal pogopin 14A can be made substantially same, thereby enhancing test accuracy to a greater extent. In addition, test signal having a high frequency can be used to carry out test. When test signal having a high frequency is used, the speed of test can be made higher.

Further, the distance $L_2$ between adjacent first-type pogopins 14A and 14A is made larger than the distance $L_1$ between adjacent first and second-type pogopins 14A and 14B. This makes it more difficult for noise signal to enter into the first signal pogopin 14A from near around, thereby causing no crosstalk.

Furthermore, all of the first-type pogopins 14A can be made to have substantially same impedance value how many first signal pogopins 14A may be used. This is more suitable for the trend of letting the contact ring have as many pogopins as possible.

LCD substrates in addition to semiconductor wafers can also be tested by the above-described probing test apparatus.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A probing test apparatus for testing electric properties of a circuit while sending a test signal to the circuit to be tested, comprising:

a probe card having a plurality of probes and first terminals to be contacted with and to be electrically connected to conductive pads of the circuit to be tested;

a test head having a signal transmitting circuit through which the test signal is transmitted to each of the probes;

a performance board having second terminals electrically connected to said signal transmitting circuit of the test head;

a contact ring interposed between the performance board and the probe card and whose impedance has been adjusted;

a plurality of first-type pogopins each having a pair of pin members contacting the first and second terminals to transmit the test signal to each of the probes said first-type pogopins being arranged in the contact ring; and a plurality of second-type pogopins each having a pair of pin members contacting the first and second terminals, said second-type pogopins being arranged in the contact ring, and spaced from said first-type pogopins in a plane perpendicular to the axes of said pin members, said second-type pogopins electrically grounded, wherein an interval $L_1$ in the plane between each of the first-type pogopins and some of the second-type pogopins which are the nearest to said each of the first-type pogopins is smaller than an interval $L_2$ in the plane between said each of the first-type pogopins and an adjacent first-type pogopin which is the nearest to said each of the first-type pogopins, and wherein for each one of said first-type pogopins the closest pogopins thereto in said plane are all second-type pogopins such that said one of said first-type pogopins is surrounded by said second type pogopins.

2. The probing test apparatus according to claim 1, wherein a ratio $L_1/L_2$ of an interval $L_2$ relative to an interval $L_1$ is smaller than one, said interval $L_1$ is a distance between each of the first-type pogopins and some of the second-type pogopins, which are nearest to said each of the first-type pogopins, and said interval $L_2$ is a distance between the first-type pogopin and some of the other first-type pogopins, which are nearest to said each of the first-type pogopins.

3. The probing test apparatus according to claim 1, wherein, as compared with each of the first-type pogopins which is the nearest to an adjacent first-type pogopin, each of the second-type pogopins is positioned nearer to said adjacent first-type pogopin.

4. The probing test apparatus according to claim 1, wherein, as compared with each of the second-type pogopins which is the nearest to an adjacent first-type pogopin, each of the first-type pogopins is positioned remote from said adjacent first-type pogopin.

5. The probing test apparatus according to claim 1, wherein each of the first-type pogopins is positioned in a center of a polygonal block which is formed four or more said second-type pogopins in the plane.

6. The probing test apparatus according to claim 5, wherein all of the second-type pogopins which form the polygonal block serve as a part to form an adjacent polygonal block.

7. The probing test apparatus according to claim 5, wherein a part of the second-type pogopins which form the polygonal block serves as a part to form an adjacent polygonal block.

8. The probing test apparatus according to claim 1, wherein each of the first-type pogopins is positioned in a center of a square block which is formed by four said second-type pogopins in the plane.

9. The probing test apparatus according to claim 1, wherein each of the first-type pogopins is positioned in a center of a regular hexagon block which is formed by six said second-type pogopins in the plane.

10. The probing test apparatus according to claim 1, wherein each of the first-type pogopins is positioned in a center of a regular octagon block which is formed by eight said second-type pogopins in the plane.

11. The probing test apparatus according to claim 1, wherein the test head sends to the each probe through the first-type pogopin the test signal which has a frequency of a range of several 10s MHz to several 100s.

* * * * *